United States Patent
Gerhard

(10) Patent No.: US 8,183,581 B2
(45) Date of Patent: May 22, 2012

(54) LED ARRANGEMENT

(75) Inventor: Detlef Gerhard, München (DE)

(73) Assignee: Siemens Aktiengesellschsft, Munich (DE)

( * ) Notice: Subject to any disclaimer, the term of this patent is extended or adjusted under 35 U.S.C. 154(b) by 0 days.

(21) Appl. No.: 12/736,835

(22) PCT Filed: May 11, 2009

(86) PCT No.: PCT/EP2009/055650
§ 371 (c)(1), (2), (4) Date: Nov. 15, 2010

(87) PCT Pub. No.: WO2009/138374
PCT Pub. Date: Nov. 19, 2009

(65) Prior Publication Data
US 2011/0062464 A1    Mar. 17, 2011

(30) Foreign Application Priority Data

May 13, 2008 (DE) .......................... 10 2008 023 369

(51) Int. Cl.
F21S 8/10 (2006.01)
F21V 21/00 (2006.01)

(52) U.S. Cl. ............ 257/82; 257/99; 257/503; 257/781; 257/758; 362/545

(58) Field of Classification Search .................. 362/545; 257/81, 82, 88, 93, 99, 503, 781, 700, 777, 257/758, 680, E33.026
See application file for complete search history.

(56) References Cited

U.S. PATENT DOCUMENTS

| | | | |
|---|---|---|---|
| 3,622,906 A * | 11/1971 | Nyul | 257/88 |
| 4,241,281 A * | 12/1980 | Morimoto et al. | 315/161 |
| 4,322,735 A * | 3/1982 | Sadamasa et al. | 257/89 |
| 7,078,729 B2 * | 7/2006 | Suzuki et al. | 257/79 |
| 7,871,839 B2 * | 1/2011 | Lee et al. | 438/34 |
| 7,880,183 B2 * | 2/2011 | Lee et al. | 257/88 |
| 8,033,698 B2 * | 10/2011 | Boivin et al. | 362/494 |
| 8,044,416 B2 * | 10/2011 | Wang et al. | 257/88 |
| 8,053,796 B2 * | 11/2011 | Wang et al. | 257/98 |
| 2003/0151343 A1 | 8/2003 | Jeganathan et al. | |
| 2004/0233671 A1 | 11/2004 | Staufert | |
| 2008/0290357 A1 * | 11/2008 | Lin et al. | 257/98 |

(Continued)

FOREIGN PATENT DOCUMENTS

DE    10 2008 023 369.2    5/2008

(Continued)

OTHER PUBLICATIONS

International Search Report for PCT/EP2009/055650, mailed on Sep. 17, 2009.
German Office Action for priority German Application No. 10 2008 023 369.2, mailed on Jan. 22, 2009.

Primary Examiner — Michael Shingleton
(74) Attorney, Agent, or Firm — Staas & Halsey LLP

(57) ABSTRACT

An LED arrangement (light emitting diode) has a plurality of adjacent radiating LEDs that are nearly identically aligned for forming an extended area light source. The LEDs are attached to a metallic multi-film support having sandwich-like insulating intermediate layers and having at least a step-like structure with at least one step. At least one LED chip is placed on each step on a metal film and the metal layer directly above is formed of a corresponding shortening or recess for mounting an LED.

20 Claims, 4 Drawing Sheets

U.S. PATENT DOCUMENTS

| | | | |
|---|---|---|---|
| 2010/0252842 A1* | 10/2010 | Tsang et al. | 257/89 |
| 2011/0006336 A1* | 1/2011 | Lee et al. | 257/99 |
| 2011/0024774 A1* | 2/2011 | Tredwell et al. | 257/93 |
| 2011/0062464 A1* | 3/2011 | Gerhard | 257/93 |
| 2011/0084612 A1* | 4/2011 | Ratcliffe et al. | 315/112 |
| 2011/0193128 A1* | 8/2011 | Lee et al. | 257/99 |
| 2011/0204327 A1* | 8/2011 | Hiruma et al. | 257/13 |
| 2011/0254025 A1* | 10/2011 | Sheu et al. | 257/88 |

FOREIGN PATENT DOCUMENTS

| | | |
|---|---|---|
| EP | 0 921 568 | 6/1999 |
| EP | PCT/EP2009/055650 | 5/2009 |
| WO | 01/43109 | 6/2001 |
| WO | 02/43134 | 5/2002 |

\* cited by examiner

LED ARRANGEMENT

CROSS REFERENCE TO RELATED APPLICATIONS

This application is based on and hereby claims priority to International Application No. PCT/EP2009/055650 filed on May 11, 2009 and German Application No. 10 2008 023 369.2 filed on May 13, 2008, the contents of which are hereby incorporated by reference.

BACKGROUND

The invention relates to an arrangement of a multiplicity of LEDs (light-emitting diodes) which emit approximately in the same direction and thus form an areally extended light source.

In the construction of very intensive light sources based on the assembly of a multiplicity of light-emitting diodes (referred to hereinafter as LED chips or as LEDs for short), a plurality of these elements are applied on a common carrier. Contact-connection takes place outside the common carrier, the individual elements being connected to one another. For relatively small arrangements comprising two by three LEDs or two by n LEDs, for example, this method may be successfully applicable.

For a known two-dimensional occupancy of an area with LEDs, hitherto interspaces have been provided between the LEDs for the mounting of the multiplicity of LEDs, as described for example in accordance with US 2004/0233671 A1.

The dense packing of the light-emitting diodes that is intended, depending on the state of development furthermore leads to evolution of heat that accordingly has to be taken into account.

Previous solution possibilities were sought for example by enlarging the chip area over which the light from the LED is emitted. However, large-area LEDs are more difficult to produce and the yield decreases greatly as the size increases. In practice, this means that high production costs have to be taken into account. A further possibility for optimizing the luminous efficiency of an areal arrangement of light sources relates to positioning the LEDs on a common carrier. However, this has the disadvantage that the packing density of the LEDs depending on unit of area is not optimal.

SUMMARY

The inventor proposes providing an LED arrangement which has a construction that is as compact as possible in conjunction with favorable dissipation of heat.

The inventor realized that LEDs can be densely packed on an areal arrangement in such a way that they represent an optimum areal illumination with emission in one direction. In this case, the LEDs are not mounted completely on a common plane, but rather have level differences in the emission direction. However, in terms of their relative orientation with respect to one another in relation to the lateral arrangement, the LEDs arranged alongside one another remain positioned in an unchanged fashion and densely or closely packed in accordance with the proposal.

A sandwich design is used for the carrier, said sandwich design comprising a plurality of metal films (also referred to as metal layers), an insulating layer respectively being interposed between the films.

If the viewing direction directly at the light-emitting areas of the LEDs is chosen for precise portrayal, then the front of the LEDs is correspondingly visible. In this case, the LED elements are packed areally closely alongside one another. In this view, as represented in FIGS. 3A, 3C and 5A, it can be discerned that the multifilm sandwich design has a step-like structure. In this case, the films end in the direction of the edge of the multilayered metal film progressively in such a way that at least one LED can be positioned on each exposed end or edge of a metal film plane. Contact-connection takes place via corresponding contact wires.

In the case of the close packing of LEDs on a carrier that is made possible by the proposed device, it is furthermore advantageous if, in addition to the stepped embodiment, the LEDs applied, for example, on a finger of a comb-type carrier are connected in series. In this case, contact wires or bonding wires are led respectively from a connection pad situated on the front side of an LED chip to adjacent metal films connected correspondingly. This results in a series circuit of the LEDs which are present on a finger and are positioned in a stepped fashion.

Furthermore, it is advantageous if regions connected in parallel are at least partially formed in addition to series connections. Particular advantages are afforded by a structural embodiment which, in addition to the compact design, provides good thermal coupling of the LEDs onto the respective metal film, the metal film preferably being connected to a heat sink at a rear location.

It is also advantageous for the multilayered arrangement of metal films embodied in sandwich form to be provided with an angle of 90°, for example, on one side, in a region in which no LED occupancy is present. Contact-connection or dissipation of the heat into a system mounted at the rear can thus be implemented in a simple manner.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
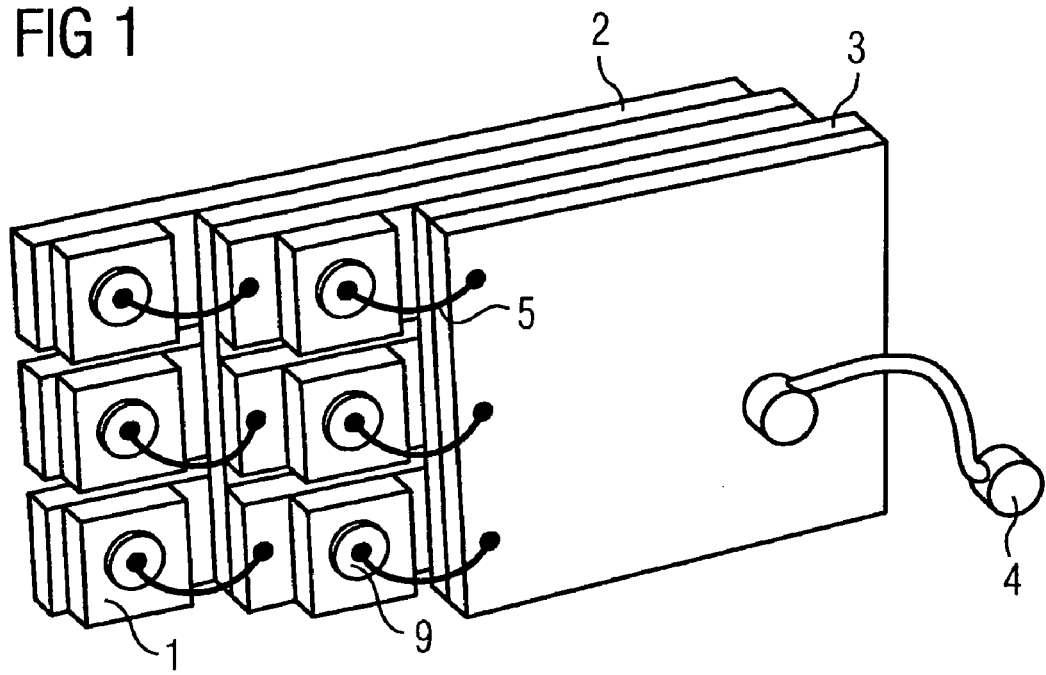
FIG. 1 shows the basic construction of an LED areal emitter with high packing density.

Reference will now be made in detail to the preferred embodiments of the present invention, examples of which are illustrated in the accompanying drawings, wherein like reference numerals refer to like elements throughout.

In accordance with the inventor's proposal, the light-emitting diodes (LEDs) are not mounted on a common area; rather, a sandwich design comprising a plurality of metal films and having intermediate insulating layers is proposed. What is crucial is that a very dense positioning of the LED chips is possible with this design, as viewed laterally. In addition, the heat developed during the operation of the LEDs can be dissipated in each case from an LED via the metal film.

Figure 2:
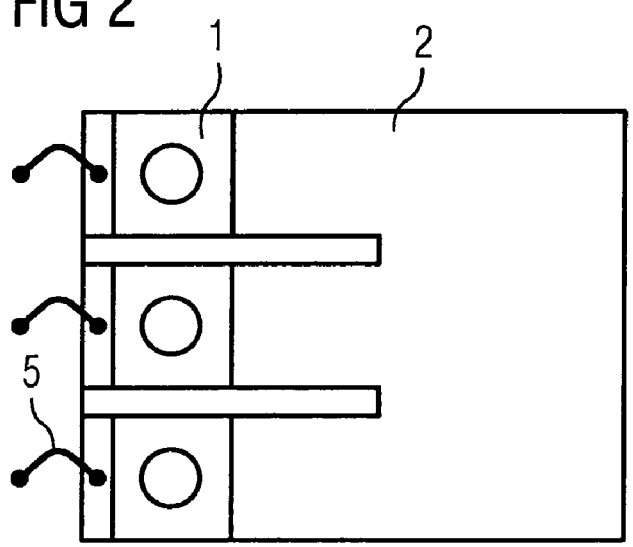
FIG. 2 shows the illustration of a metal film comb with three LED chips positioned at the ends of the respective fingers, FIGS. 3A, 3B and 3C respectively show a plan view, a side view and a three-dimensional view of an LED areal emitter.

This occupancy concept for a carrier for realizing an areal emitter can furthermore advantageously be equipped with the following features:

For the parallel connection of different LEDs connected in series in groups, the metal film is embodied in the form of a comb, for example, as illustrated in FIG. 1 or FIG. 2. The plan view reveals the main web of the comb with a perpendicularly extended finger, the multilayer films in each case extending to different extents as far as the end of a finger. A uniform step structure is thus formed, wherein an LED is in each case positioned at the end of a finger, said LED being contact-connected toward the bottom on a metal film and toward the top to the next metal film with corresponding polarity.

It is advantageous for a comb structure to be embodied in a metal film system continuously from top to bottom. However, a partial embodiment is likewise possible.

For better spatial and/or thermal design of the areal emitters, the metal film can be angled on projecting ends in such a way that it can easily be attached to superordinate systems.

FIG. 1 shows the basic construction of the LED areal emitter with corresponding stepping. In principle, the LEDs are mounted on different metal films. The metal films are arranged one above another in the form of a sandwich design. The respective insulating layer situated between the films bears the reference symbol 3. In accordance with FIG. 1, the metal film comb 2 has two layers and additionally the upper cover layer, which is connected toward the outside via the electrical contact 4. A series connection of two LEDs in each case is indicated in FIG. 1. Said series connection correspondingly takes place via contact wires 5 between metal film 2 and bonding pad 9 of the closest LED. The bottommost arrangement of three LEDs 1 is contact-connected via the corresponding LED chips to the bottom, in FIG. 1 rearmost, metal film, which is embodied in a comb-like fashion, and from there is likewise connected toward the outside via an electrical connection.

FIG. 2 represents an illustration of the metal film comb 2. A main web with three fingers pointing toward the left is illustrated in the plan view. The LED chips 1 are mounted at the respective ends and contact-connected toward the bottom via the contact wires 5 to other metal films. Furthermore, the LED chips 1 are mounted on the respective metal film in such a way that their operating heat can be dissipated via said metal film. So-called bonding pads 9 are provided centrally on the LED chips 1. Said bonding pads are contact-connected toward the top by further contact wires 5, so-called bonding wires. The metal film thickness ideally corresponds to the thickness of an LED chip 1.

Figure 3A:
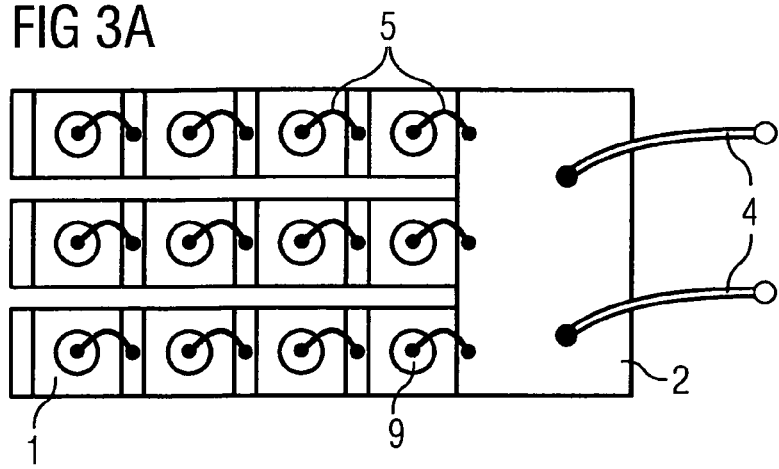

FIG. 3A shows, in the plan view, the realization of a plurality of LEDs connected in series. In this case, too, the metal film comb 2 has three fingers. On each finger, a stepped structure of a total of four steps is formed by virtue of the fact that each metal film extends to a different extent on a finger toward the front as far as the end thereof. In this case, the bottommost metal film is fully formed. A respective chip is correspondingly applied at the tip of a finger. The next higher layer of a metal film is shortened by the areal extent of an LED chip. A further LED chip 1 is again applied in each case on corresponding free ends. In the same way, in FIG. 3A the third and fourth LEDs are mounted and electrically connected in series via contact wires 5.

Figure 3B:
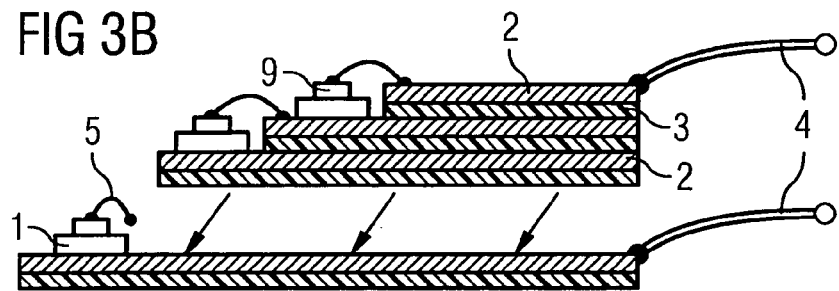

FIG. 3B shows the side view of an illustration corresponding to FIG. 3A which is represented partly in exploded illustration. The step-like embodiment of the sandwich structure of a metal film multilayer carrier is clearly discernible here. Electrical connections 4 for making contact toward the outside are provided on the bottommost and topmost metal films. The metal films in each case make contact with an LED chip 1 from below. Via contact wires 5, the bonding pad 9 associated with an LED chip 1 is contact-connected to a higher, but not overlying, metal film.

Figure 3C:
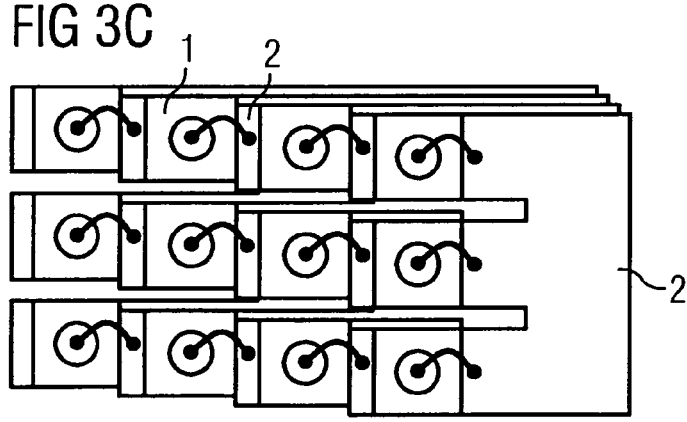
Figure 4:
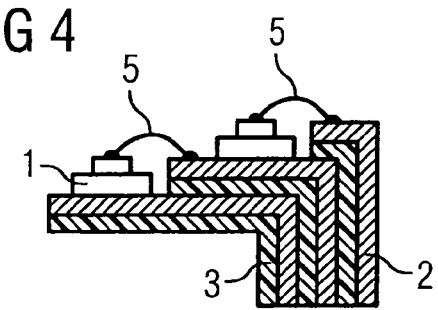
FIG. 4 shows the side view of a metal film carrier with interposed insulating layers which is embodied in a bent fashion and partially represents a comb with a finger in section.

FIG. 3C represents a three-dimensional view of an illustration corresponding to FIG. 3A or 3B.

The arrangement of LEDs connected in series is ideally realized by a connection from the metal film onto a corresponding bonding pad 9 of the LED situated on the underlying metal film.

In principle, the electrical contact-connection is implemented, whether it be in series or in parallel, in such a way that no short circuits whatsoever occur. The sandwich design of the multilayer metal film can also be embodied such that the metal films of the individual planes have more than one comb, in which case, in accordance with FIG. 5 or else in accordance with FIG. 1, the topmost metal film has a circumferential electrical contact with which all combs of a plane can be supplied electrically.

The entire areal emitter comprises at least the LED-carrying metal films and can additionally have an illumination optical unit, and also a cooling system.

Figure 6:
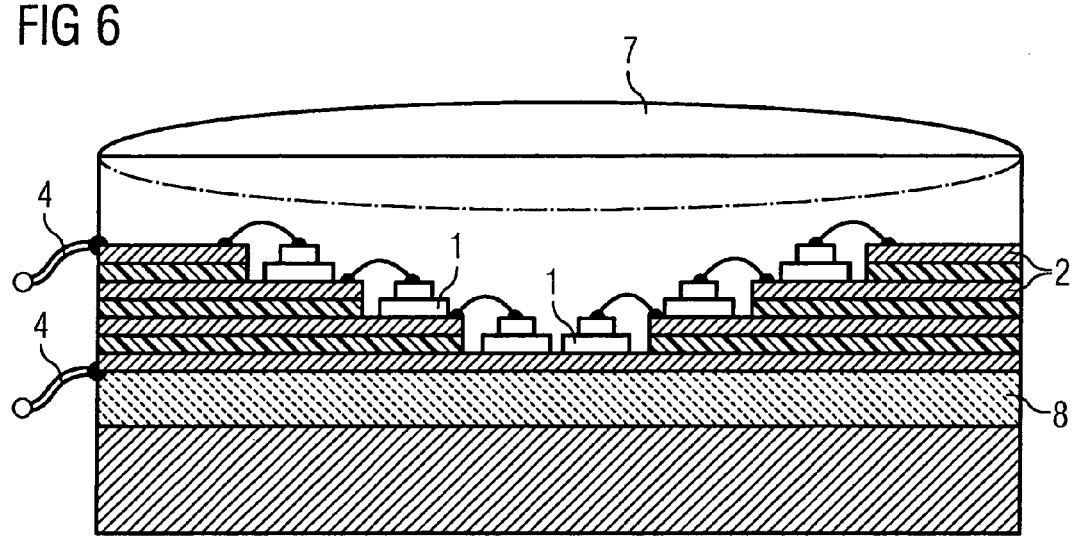
FIG. 6 shows the principle of a construction for an areal emitter with illumination optical unit and cooling system.

FIG. 6 shows the basic construction of an areal emitter comprising illumination optical unit with centrally positioned LED construction and cooling system or heat sink or cooling body situated at the bottom.

Figure 5A:
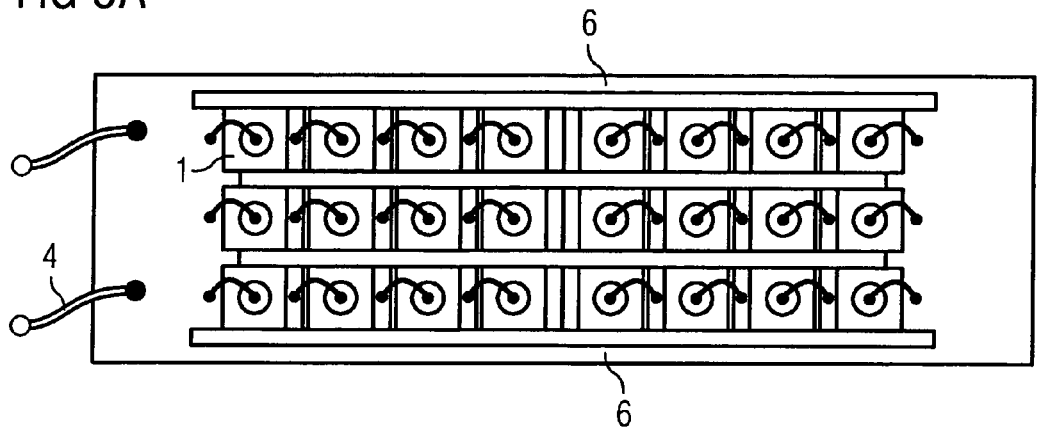
FIGS. 5A, 5B and 5C show the plan view, the side view and the three-dimensional view of an LED areal emitter realized in a symmetrical double embodiment.
Figure 5B:
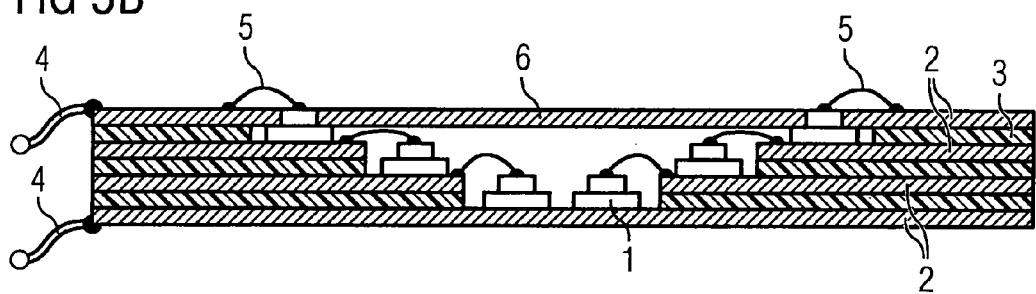
Figure 5C:
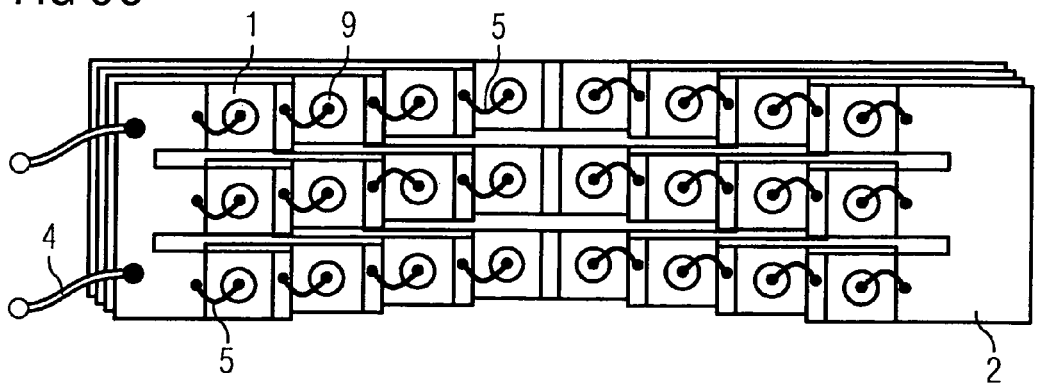

FIGS. 5A, 5B and 5C show in that order a plan view, a side view and a three-dimensional view of an LED areal emitter having a high packing density. In this case, in accordance with FIG. 5B, the symmetrical double embodiment of an LED areal emitter described above can easily be seen. The electrical contact-connection of all LEDs is ensured by the electrical connection 6, which can also be realized by a metal film.

FIG. 5C shows the illustration in accordance with FIGS. 5A, 5B in the three-dimensional view. The electrical connection 6 can only be discerned in FIG. 5B.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV,* 69 USPQ2d 1865 (Fed. Cir. 2004).

The invention claimed is:
1. An light emitting diode (LED) arrangement, comprising:
a plurality of LED chips which are arranged in an adjacent fashion, which emit in an approximately identical direction and which together form an areally extended light source; and
a metallic multi-film carrier, which has insulating intermediate layers sandwiched between metal films, the metallic multi-film carrier having a stepped structure with a plurality of steps, wherein
each step is formed by a corresponding shortening or cutout of a respective overlying metal film, such that each step includes at least one insulating intermediate layer and at least one metal film,
each LED chip is positioned on a step and electrically contact-connected to the metal film of the step, and each LED chip is also electrically contact-connected to the metal film of an adjacent step.

2. The LED arrangement as claimed in claim 1, wherein at least some of the LED chips are connected in series.

3. The LED arrangement as claimed in claim 1, wherein
the LED chips are divided into groups, and
the LED chips of each group are connected in series.

4. The LED arrangement as claimed in claim 1, wherein at least some of the LED chips are connected in parallel.

5. The LED arrangement as claimed in claim 1, wherein
the LED chips are divided into groups, and
the LED chips of each group are connected in parallel.

6. The LED arrangement as claimed in claim 1, wherein
an electrical circuit connects the LED chips,
the electrical circuit includes a plurality of series LED connections and a plurality of parallel LED connections.

7. The LED arrangement as claimed in claim 6, wherein each LED is connected to at least one series connection and at least one parallel connection.

8. The LED arrangement as claimed in claim 3,
metal films of adjacent steps have opposite polarity, and
each LED chip has an electrical connection pad coupled via a contact wire to the metal film of the adjacent step, which metal film has opposite polarity.

9. The LED arrangement as claimed in claim 8, wherein the metal films, at regions remote from the LED chips, are contact-connected to a control source via respective electrical connections.

10. The LED arrangement as claimed in claim 9, wherein the metal films are thermally connected to the LED chips to dissipate heat from the LED chips.

11. The LED arrangement as claimed in claim 10, wherein
the LED chips are divided into groups, and
the LED chips of each group are connected in parallel.

12. The LED arrangement as claimed in claim 11, wherein
an electrical circuit connects the LED chips,
the electrical circuit includes a plurality of series LED connections and a plurality of parallel LED connections.

13. The LED arrangement as claimed in claim 10, wherein
the LED arrangement has opposing light-emitting and remote sides, the LED chips being provided on the light-emitting side, and
the metal films are connected to a heat sink at the remote side.

14. The LED arrangement as claimed in claim 1, wherein
the LED arrangement has opposing light-emitting and remote sides, the LED chips being provided on the light-emitting side, and
an illumination optical unit is present on the light-emitting side, the illumination optical unit at least partially covers the LED chips and is formed of an electrically nonconductive material.

15. The LED arrangement as claimed in claim 1, wherein the metallic multi-film carrier is bent approximately 90° in a region not occupied by LED chips.

16. The LED arrangement as claimed in claim 1, wherein
the metallic multi-film carrier has upper and lower metal films, and
an external electrical connection to the LED arrangement extends from each of the upper and lower metal films.

17. The LED arrangement as claimed in claim 1, wherein the LED arrangement is formed with a comb-like structure such that adjacent LED chips are separately provided on different fingers.

18. The LED arrangement as claimed in claim 17, wherein the comb-like structure is formed in a single metallic multi-film carrier such that each step is separated into a plurality of finger portions.

19. The LED arrangement as claimed in claim 1, wherein
the LED arrangement has opposing light-emitting and remote sides, the LED chips being provided on the light-emitting side, and
an optical unit is provided on the light-emitting side, and
a cooling system is provided on the remote side.

20. A structure comprising a plurality of light emitting diode (LED) arrangements mechanically or electrically connected to one another, each LED arrangement comprising:
a plurality of LED chips which are arranged in an adjacent fashion, which emit in an approximately identical direction and which together form an areally extended light source; and
a metallic multi-film carrier, which has insulating intermediate layers sandwiched between metal films, the metallic multi-film carrier having a stepped structure with a plurality of steps, wherein
each step is formed by a corresponding shortening or cutout of a respective overlying metal film, such that each step includes at least one insulating intermediate layer and at least one metal film,
each LED chip is positioned on a step and electrically contact-connected to the metal film of the step, and
each LED chip is also electrically contact-connected to the metal film of an adjacent step.

* * * * *